US012495248B2

(12) United States Patent
Liu et al.

(10) Patent No.: US 12,495,248 B2
(45) Date of Patent: Dec. 9, 2025

(54) ENVIRONMENTAL SOUND PASS-THROUGH METHOD AND APPARATUS APPLIED TO VR, DEVICE AND STORAGE MEDIUM

(71) Applicant: Luxshare Precision Technology (Nanjing) Co., LTD, Nanjing (CN)

(72) Inventors: Lianhui Liu, Nanjing (CN); Yang Zhang, Nanjing (CN); Ruyi Liu, Nanjing (CN); Guojun Xu, Nanjing (CN)

(73) Assignee: LUXSHARE PRECISION TECHNOLOGY (NANJING) CO., LTD, Nanjing (CN)

( * ) Notice: Subject to any disclaimer, the term of this patent is extended or adjusted under 35 U.S.C. 154(b) by 233 days.

(21) Appl. No.: 18/209,377

(22) Filed: Jun. 13, 2023

(65) Prior Publication Data

US 2024/0171910 A1 May 23, 2024

(30) Foreign Application Priority Data

Nov. 23, 2022 (CN) ......................... 202211477037.4

(51) Int. Cl.
*H04R 1/32* (2006.01)
*H03G 3/20* (2006.01)
*H04R 3/12* (2006.01)

(52) U.S. Cl.
CPC ................. *H04R 3/12* (2013.01); *H03G 3/20* (2013.01); *H04R 1/32* (2013.01)

(58) Field of Classification Search
CPC .. H04R 3/12; H04R 1/32; H04R 3/005; H04S 7/302; H04S 7/303; H04S 7/304; H04S 7/306
See application file for complete search history.

(56) References Cited

U.S. PATENT DOCUMENTS 5,181,248 A 1/1993 Inanaga et al.
10,219,083 B2 * 2/2019 Farmani ............... H04R 25/552
(Continued)

FOREIGN PATENT DOCUMENTS

CN 106937531 A 7/2017
CN 109804559 A 5/2019
(Continued)

OTHER PUBLICATIONS

Japanese Office Action for Japanese Application No. 2023-091431, dated Aug. 29, 2024, with English translation.

*Primary Examiner* — Disler Paul
(74) *Attorney, Agent, or Firm* — Birch, Stewart, Kolasch & Birch, LLP

(57) ABSTRACT

Provided are an environmental sound pass-through method and apparatus applied to VR, a device and a storage medium. The method includes the steps below. Environmental audio information of an ambient environment is acquired by a microphone on a VR device based on a see-through mode of the VR device. The environmental audio information is located to determine sound source position information according to the time difference of the environmental audio information reaching microphones on the VR device, and a filtering process is performed on the environmental audio information to determine filtered audio information. Directional pickup is performed on the filtered audio information to determine to-be-processed audio information according to the sound source position information. A signal amplitude and pass-through loudness of the to-be-processed audio information are adjusted to determine target audio information, and the target audio information is played by a speaker of the VR device.

13 Claims, 4 Drawing Sheets

(56) References Cited

U.S. PATENT DOCUMENTS

| | | | | | |
|---|---|---|---|---|---|
| 11,219,386 | B2 * | 1/2022 | Lesso | A61B 5/6803 | |
| 11,410,678 | B2 * | 8/2022 | Lesso | G10L 25/51 | |
| 11,659,324 | B1 * | 5/2023 | Donley | H04R 5/033 | 381/92 |
| 11,682,414 | B1 * | 6/2023 | Vitt | G10L 21/0324 | 704/200 |
| 11,763,792 | B2 * | 9/2023 | Tait | H04R 5/033 | 381/71.6 |
| 11,818,561 | B1 * | 11/2023 | Nawfal | H04R 5/04 | |
| 12,101,620 | B2 * | 9/2024 | Narula | H04S 3/008 | |
| 2001/0046304 | A1 * | 11/2001 | Rast | H04R 1/1083 | 381/26 |
| 2012/0050021 | A1 * | 3/2012 | Rao | B60N 2/28 | 340/425.5 |
| 2017/0011210 | A1 | 1/2017 | Cheong et al. | | |
| 2022/0131963 | A1 | 4/2022 | Hoellwarth | | |

FOREIGN PATENT DOCUMENTS

| | | | |
|---|---|---|---|
| JP | 2019-102062 | A | 6/2019 |
| TW | 200833158 | A | 8/2008 |
| WO | WO 2013/094103 | A1 | 6/2013 |
| WO | WO 2022/028481 | A1 | 2/2022 |

* cited by examiner

ENVIRONMENTAL SOUND PASS-THROUGH METHOD AND APPARATUS APPLIED TO VR, DEVICE AND STORAGE MEDIUM

CROSS-REFERENCE TO RELATED APPLICATION(S)

This application claims priority to Chinese Patent Application No. 202211477037.4 filed Nov. 23, 2022, the disclosure of which is incorporated herein by reference in its entirety.

TECHNICAL FIELD

Embodiments of the present invention relate to the field of virtual reality (VR) and, in particular, to an environmental sound pass-through method and apparatus applied to VR, a device and a storage medium.

BACKGROUND

A VR device can virtualize three dimensional (3D) images similar to the real environment on an optical lens through visual processing technologies. For a headset VR device, when wearing it, a user of the VR device, since line of sight is blocked by structures such as lenses, cannot see the ambient environment. To enhance the immersion of the auditory experience of the user of the VR device, the headset VR device is usually equipped with a wired earphone interface, so the user can isolate part of environmental noises when wearing earphones and using the VR device for watching movies or playing games. The degree of isolation of environmental noises depends on the noise reduction performance of the earphones. For the earphones having better noise reduction performance, when the VR device is switched to a see-through mode, the user can visually see the ambient environment, but cannot clearly hear the environmental sounds. For example, in a conversation scenario with the outside, the user must take off the earphones to hear the conversation, thereby reducing the use experience of the user with the VR device. Therefore, how to enable the VR device to achieve an environmental sound pass-through function so that the VR device, in the see-through mode, can clearly hear the environmental sounds by a speaker, is a problem that needs to be solved.

SUMMARY

The present invention provides an environmental sound pass-through method and apparatus applied to VR, a device and a storage medium so that a VR device can achieve an environmental sound pass-through function and in a see-through mode, can clearly hear environmental sounds by a speaker.

According to an aspect of the present invention, an environmental sound pass-through method applied to VR is provided. The method includes the steps below.

Environmental audio information of an ambient environment is acquired by a microphone on a VR device based on a see-through mode of the VR device.

The environmental audio information is located to determine sound source position information according to a time difference of the environmental audio information reaching microphones on the VR device, and a filtering process is performed on the environmental audio information to determine filtered audio information.

Directional pickup is performed on the filtered audio information to determine to-be-processed audio information according to the sound source position information.

A signal amplitude and pass-through loudness of the to-be-processed audio information are adjusted to determine target audio information according to a noise reduction degree and a speaker frequency response characteristic of the VR device, and the target audio information is played by a speaker of the VR device.

According to another aspect of the present invention, an environmental sound pass-through apparatus applied to VR is provided. The apparatus includes an environmental audio information acquisition module, a filtered audio information determination module, a directional pickup module, and a target audio information determination module.

The environmental audio information acquisition module is configured to acquire, by a microphone on a VR device, environmental audio information of an ambient environment based on a see-through mode of the VR device.

The filtered audio information determination module is configured to locate the environmental audio information to determine sound source position information according to a time difference of the environmental audio information reaching microphones on the VR device, and perform a filtering process on the environmental audio information to determine filtered audio information.

The directional pickup module is configured to perform directional pickup on the filtered audio information to determine to-be-processed audio information according to the sound source position information.

The target audio information determination module is configured to adjust a signal amplitude and pass-through loudness of the to-be-processed audio information to determine target audio information according to a noise reduction degree and a speaker frequency response characteristic of the VR device, and play the target audio information by a speaker of the VR device.

According to another aspect of the present invention, an electronic device is provided. The electronic device includes: at least one processor and a memory communicatively connected to the at least one processor, where the memory stores a computer program executable by the at least one processor to enable the at least one processor to perform the environmental sound pass-through method of any one of embodiments described above.

According to another aspect of the present invention, a non-transitory computer-readable storage medium is provided. The non-transitory computer-readable storage medium is configured to store a computer instruction which, when executed by a processor, causes the processor to perform the environmental sound pass-through method of any one of embodiments described above.

In the solutions of the embodiments of the present invention, the environmental audio information of the ambient environment is acquired by the microphone on the VR device based on the see-through mode of the VR device. The environmental audio information is located to determine sound source position information according to the time difference of the environmental audio information reaching the microphones on the VR device, and the filtering process is performed on the environmental audio information to determine filtered audio information. The directional pickup is performed on the filtered audio information to determine the to-be-processed audio information according to the sound source position information. The signal amplitude and pass-through loudness of the to-be-processed audio information are adjusted to determine target audio information according to the noise reduction degree and the speaker frequency response characteristic of the VR device, and the target audio information is played by the speaker of the VR device. In this manner, the problem that the user of the VR product can only see ambient environment images but cannot hear ambient environment sounds after the VR product, during use, turns on the see-through mode is solved. In the above solutions, when the VR device is switched to the see-through mode, the environmental audio information is acquired by the microphone, the sound source position information of the environmental audio information is located, and the filtering process is performed on the environmental audio information, improving the clarity of the environmental audio information. The directional pickup is performed on the filtered audio information according to the sound source position information so that the extraction efficiency and accuracy of the to-be-processed audio information. According to the characteristics of the speaker of the VR device, the signal amplitude and pass-through loudness of the to-be-processed audio information are adjusted to ensure the target audio information played out by the speaker not to be suddenly large or small, improving the volume stability of the target audio information, meanwhile, enabling the adjusted target audio information to be much closer to the real environmental sounds, and improving the use experience of the user with the VR device.

It is to be understood that the content described in this part is neither intended to identify key or important features of embodiments of the present invention nor intended to limit the scope of the present invention. Other features of the present invention are apparent from the description provided hereinafter.

BRIEF DESCRIPTION OF DRAWINGS

To illustrate solutions in embodiments of the present invention more clearly, the drawings used in description of the embodiments are described below. Apparently, the drawings described below merely illustrate part of the embodiments of the present invention, and those of ordinary skill in the art may obtain other drawings based on the drawings described below on the premise that no creative work is done.

DETAILED DESCRIPTION

For a better understanding of the solutions of the present invention by those skilled in the art, the solutions in embodiments of the present invention are described clearly and completely below in conjunction with the drawings in the embodiments of the present invention. Apparently, the embodiments described below are part, not all, of the embodiments of the present invention. Based on the embodiments of the present invention, all other embodiments obtained by those of ordinary skill in the art on the premise that no creative work is done are within the scope of the present invention.

It is to be noted that the terms "first", "second" and the like in the description, claims and drawings of the present invention are used for distinguishing between similar objects and are not necessarily used to describe a particular order or sequence. It is to be understood that the data used in this way is interchangeable where appropriate so that the embodiments of the present invention described herein may also be implemented in a sequence not illustrated or described herein. In addition, terms "including" and "and so on" or any variations thereof are intended to encompass a non-exclusive inclusion. For example, a process, method, system, product or apparatus that includes a series of steps or units not only includes the expressly listed steps or units but may also include other steps or units that are not expressly listed or are inherent to such a process, method, product or apparatus.

Embodiment One

Figure 1:
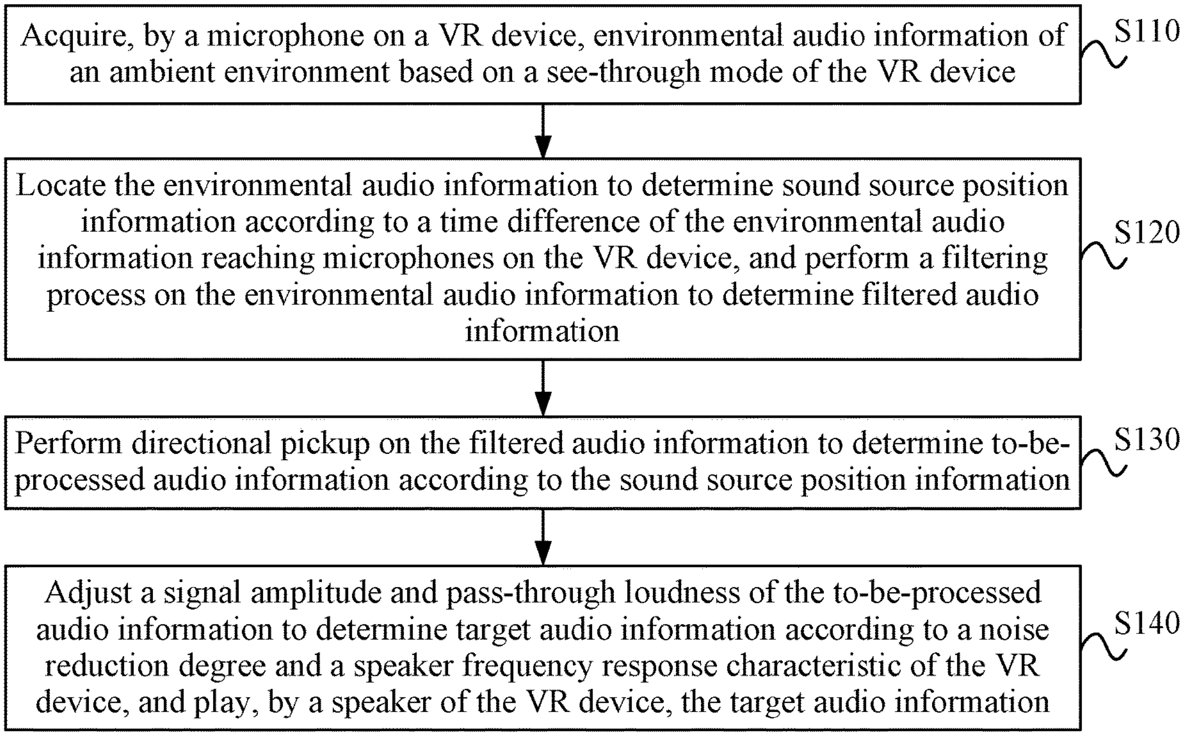
FIG. 1 is a flowchart of an environmental sound pass-through method applied to VR according to embodiment one of the present invention.

FIG. 1 is a flowchart of an environmental sound pass-through method applied to VR according to embodiment one of the present invention. This embodiment is applicable to the case where a VR device achieves the environmental sound pass-through. The method may be performed by an environmental sound pass-through apparatus applied to the VR that may be implemented in hardware and/or software and configured in an electronic device. As shown in FIG. 1, the method includes the steps below.

In S110, environmental audio information of an ambient environment is acquired by a microphone on a VR device based on a see-through mode of the VR device.

It is to be noted that, to enable the user using the VR device to conveniently see the ambient environment without taking off the device, at present, a see-through technology that uses the camera of the VR device to capture ambient environment images in real time and display the ambient environment images on the lenses of the VR device, is generally used. The user can switch the display contents on the lens between virtual images and real images by a trigger operation such as pressing a button. When the user wears the VR device that is in the normal mode to play games or watch movies, the optical lenses of the VR device display the game images or movie images. To enhance the immersive experience of the user and prevent the user from being disturbed by external light, structures such as the housing and the optical lens of the VR device generally form a light-shielding area in front of eyes. In this case, the user cannot see the ambient environment of the VR device. Moreover, the speaker of the VR device plays sounds of the games or movies being played by the VR device. The environmental audio information of the ambient environment, after the noise reduction process of the VR device itself or the active or passive noise reduction of the earphones, has been attenuated to be relatively weak as being transmitted to the human ears, and the user may not be able to clearly hear part of sounds of the environmental sounds.

Here, the see-through mode is the see-through mode of the VR device achieved by the VR device using the see-through technology. The environmental audio information refers to sound information in the ambient environment around the VR device.

Specifically, when the user of the VR device needs to perceive the ambient environment during use of the VR device, the user of the VR device can trigger the see-through function of the VR device to send a mode switch instruction to the VR device. The VR device, in response to the mode switch instruction, switches to the see-through mode. In the see-through mode, the VR device uses see-through algorithms, turns on the camera of the VR device by a control unit of the VR device to collect the ambient environment images in real time, and displays the ambient environment images on the optical lens of the VR device so that the user can view the ambient environment images through the optical lens. Moreover, the VR device turns on the microphone by the control unit of the VR device to collect the environmental audio information of the ambient environment in real time.

For example, the method of acquiring, by the microphone on the VR device, the environmental audio information of the ambient environment may be: acquiring, by the microphone on the VR device, mixing audio information; and performing an echo cancellation process on the mixing audio information to determine the environmental audio information of the ambient environment.

Here, the mixing audio information may include environmental audio information, earphone noise audio information, or sounds from the speaker of the VR device itself.

It is to be understood that the step of performing the echo cancellation process on the mixing audio information collected by the microphone can eliminate the sounds from the speaker of the VR device itself or the earphones that may exist in the mixing audio information and improve the sound clarity of the environmental audio information.

In S120, the environmental audio information is located to determine sound source position information according to a time difference of the environmental audio information reaching microphones on the VR device, and a filtering process is performed on the environmental audio information to determine filtered audio information.

Here, the sound source position information refers to direction information on a position where the sound source sending out the environmental audio information is located.

Specifically, multiple microphones are mounted on the VR device, for example, two or four microphones may be mounted on the VR device. Audio acquisition times for acquiring the environmental audio information by the microphones on the VR device are acquired, the audio acquisition times corresponding to the microphones are two-at-a-time subtracted to respectively determine time differences of acquiring the environmental audio information between each microphone and other microphones. According to the time differences, the environmental audio information is positioned so that the sound source position information can be determined. A filter is used for performing the filtering process on the environmental audio information to determine the filtered audio information.

For example, if two microphones are mounted on the VR device, namely, microphone No. 1 and microphone No. 2. If the time difference of the environmental audio information reaching microphone No. 1 and microphone No. 2 is two milliseconds, and the environmental audio information first reaches microphone No. 1, the sound source position information is located in the 0° direction of the VR device. If the environmental audio information reaches microphone No. 1 and microphone No. 2 at the same time, the sound source position information is located in the 90° direction of the VR device. If the environmental audio information first reaches microphone No. 2, the sound source position information is located in the 180° direction of the VR device.

For example, the method of determining the filtered audio information may be: determining a sound band of the environmental audio information, determining an audio property of the environmental audio information according to the sound band, and determining a target passband according to the audio property and a correspondence between a candidate property and a filter passband; and performing the filtering process on the environmental audio information to determine the filtered audio information based on the target passband.

Here, the audio property refers to data that represents the sound source sending out the environmental audio information. The sound source sending out the environmental audio information may be a person or a vehicle. The target passband refers to the passband of the filter used by the filter performing the filtering process on the environmental audio information.

Specifically, different audio properties correspond to different sound bands. It is feasible to after the environmental audio information is acquired, determine the sound band of the environmental audio information, and determine the audio property corresponding to the sound band of the environmental audio information as the audio property of the environmental audio information; determine the target passband according to the audio property and the correspondence between the preset candidate property and the filter passband; and perform the filtering process on the environmental audio information to determine the filtered audio information based on the target passband.

For example, if the environmental audio information is determined to be the sound made by a person according to the audio property, the target passband may be set from 200 to 3000 Hz. If the environmental audio information is determined to be the sound made by a vehicle according to the audio property, the filter passband may be set from 1000 to 5000 Hz.

In S130, directional pickup is performed on the filtered audio information to determine to-be-processed audio information according to the sound source position information.

Here, directional pickup refers to the technology of acquiring only the audio information that needs acquiring and ignoring background noises.

Specifically, it is feasible to estimate and plan the sound source range of the environmental audio information according to the sound source position information, where the sound source range refers to an area range where the sound source of the environmental audio information may exist; and perform the directional pickup on the filtered audio information in the sound source range to determine to-be-processed audio information.

In S140, a signal amplitude and pass-through loudness of the to-be-processed audio information are adjusted to determine target audio information according to a noise reduction degree and a speaker frequency response characteristic of the VR device, and the target audio information is played by a speaker of the VR device.

The target audio information refers to audio information that needs to be played by the speaker of the VR device. The pass-through loudness refers to loudness of the target audio information played by the speaker of the VR device.

Specifically, it is feasible to adjust the signal amplitude of the to-be-processed audio information according to the noise reduction degree of the VR device itself or the noise reduction degree of the external earphones to ensure the magnitude of the pass-through volume heard by the user to be close to the magnitude of the real environmental sounds; and adjust the pass-through loudness of the to-be-processed audio information according to the speaker frequency response characteristic to ensure the frequency characteristic of the target audio information to be stable.

Optionally, while the speaker of the VR device plays the target audio information, it is also feasible to control the speaker to shield other audio information other than the target audio information.

Moreover, when the user switches the VR device from the see-through mode to the normal mode, the control unit of the VR device turns off the camera and the microphone, the optical lens of the VR device returns to display the images in the normal mode, and the speaker also continues to play the audio information of the games or movies in the normal mode.

In the above solutions, it can be ensured that when the target audio information is played, the other audio information does not cause sound interference to the target audio information.

In the solutions of the embodiments of the present invention, the environmental audio information of the ambient environment is acquired by the microphone on the VR device based on the see-through mode of the VR device. The environmental audio information is located to determine sound source position information according to the time difference of the environmental audio information reaching microphones on the VR device, and the filtering process is performed on the environmental audio information to determine filtered audio information. The directional pickup is performed on the filtered audio information to determine the to-be-processed audio information according to the sound source position information. The signal amplitude and pass-through loudness of the to-be-processed audio information are adjusted to determine target audio information according to the noise reduction degree and the speaker frequency response characteristic of the VR device, and the target audio information is played by the speaker of the VR device. In this manner, the problem that the user of the VR product can only see the ambient environment images but cannot hear the ambient environment sounds after the VR product, during use, turns on the see-through mode is solved. In the above solutions, when the VR device is switched to the see-through mode, the environmental audio information is acquired by the microphone, the sound source position information of the environmental audio information is located, and the filtering process is performed on the environmental audio information, improving the clarity of the environmental audio information. The directional pickup is performed on the filtered audio information according to the sound source position information so that the extraction efficiency and accuracy of the to-be-processed audio information. According to the characteristics of the speaker of the VR device, the signal amplitude and pass-through loudness of the to-be-processed audio information are adjusted to ensure the target audio information played out by the speaker not to be suddenly large or small, improving the volume stability of the target audio information, meanwhile, enabling the adjusted target audio information to be much closer to the real environmental sounds, and improving the use experience of the user with the VR device.

Embodiment Two

Figure 2:
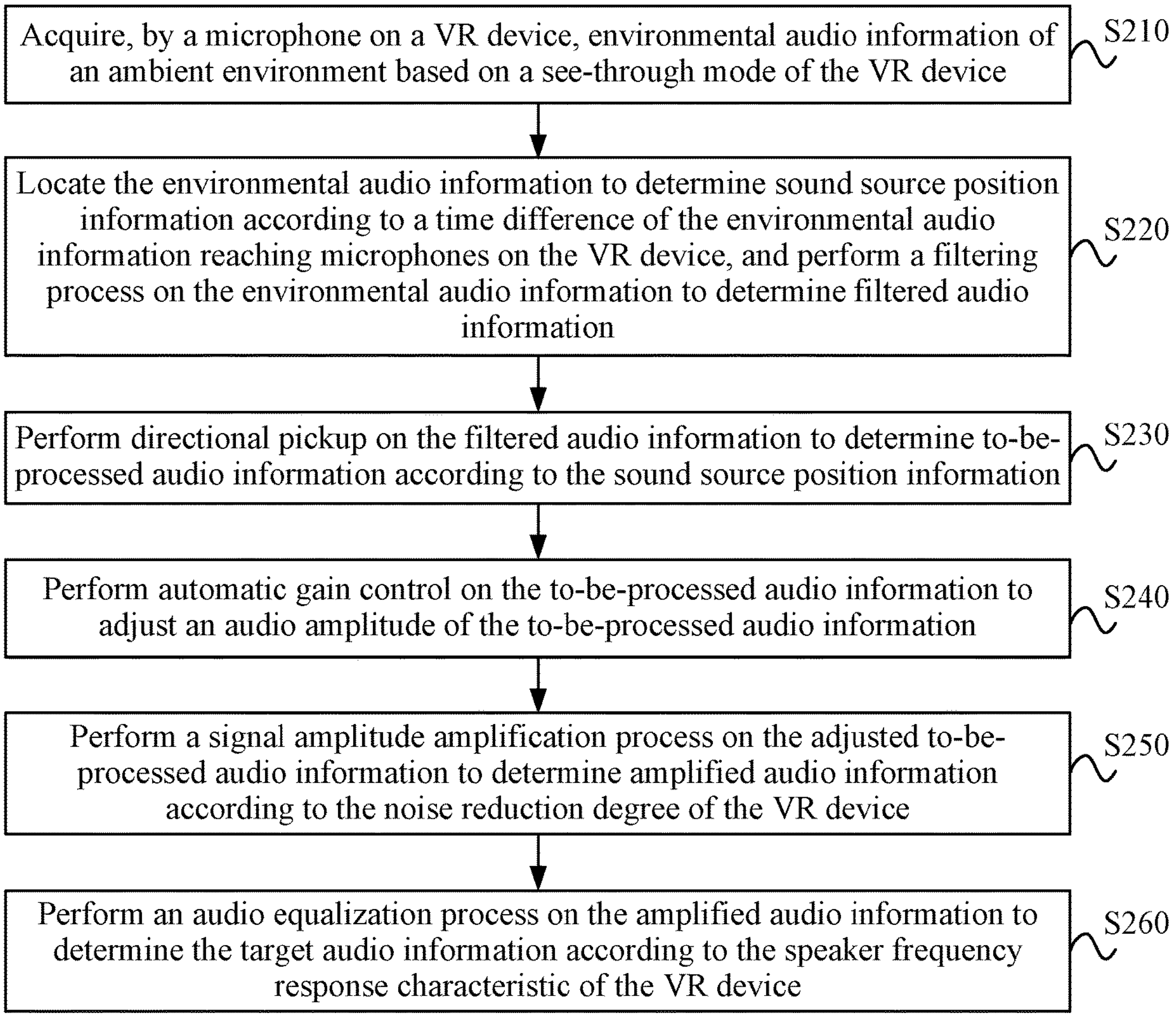
FIG. 2 is a flowchart of an environmental sound pass-through method applied to VR according to embodiment two of the present invention.

FIG. 2 is a flowchart of an environmental sound pass-through method applied to VR according to embodiment two of the present invention. This embodiment is optimized on the basis of the above embodiment to provide a preferred embodiment for adjusting the signal amplitude and pass-through loudness of the to-be-processed audio information to determine the target audio information. Specifically, as shown in FIG. 2, the method includes the steps below.

In S210, environmental audio information of an ambient environment is acquired by a microphone on a VR device based on a see-through mode of the VR device.

In S220, the environmental audio information is located to determine sound source position information according to a time difference of the environmental audio information reaching microphones on the VR device, and a filtering process is performed on the environmental audio information to determine filtered audio information.

In S230, directional pickup is performed on the filtered audio information to determine to-be-processed audio information according to the sound source position information.

S240, automatic gain control is performed on the to-be-processed audio information to adjust an audio amplitude of the to-be-processed audio information.

Here, the automatic gain control (AGC) refers to an automatic control method where the gain of the audio amplitude of a to-be-processed audio is adjusted according to the magnitude of the audio amplitude.

Specifically, when the VR device is in the see-through mode and receives the environmental audio information from the ambient environment, the volume of the environmental audio information may be unstable, so the user needs to frequently adjust the playback volume to meet the needs of hearing. Therefore, the volume equalization process on the environmental audio information is particularly important. It is feasible to perform the automatic gain control on the to-be-processed audio information to adjust the audio amplitude of the to-be-processed audio information according to the actual audio of the to-be-processed audio information so that the audio amplitude of the to-be-processed audio information is maintained in a stable and user-perceptible range.

For example, the automatic gain control of the to-be-processed audio information can be achieved by the sub-steps below.

In S2401, if an amplitude variation value of the to-be-processed audio information is greater than a variation threshold, and the audio amplitude of the to-be-processed audio information is less than a first audio threshold, the automatic gain control is performed on the audio amplitude of the to-be-processed audio information to achieve an enhancement adjustment of the to-be-processed audio information according to the amplitude variation value.

Here, the amplitude variation value refers to the difference value between the audio amplitude of the to-be-processed audio information acquired at a previous time and the audio amplitude of the to-be-processed audio information acquired at a current time. The variation threshold and the first audio threshold may be set according to actual needs.

Specifically, the difference value between the audio amplitude of the to-be-processed audio information acquired at the previous time and the audio amplitude of the to-be-processed audio information acquired at the current time is used as the amplitude variation value of the to-be-processed audio information. The amplitude variation value is compared with the variation threshold are compared, meanwhile, the audio amplitude of the to-be-processed audio information is compared with the first audio threshold. If the amplitude variation value is greater than a preset variation threshold and the audio amplitude of the to-be-processed audio information is less than the first audio threshold, a gain value of the audio amplitude when the automatic gain control is performed on the audio amplitude of the to-be-processed audio information is determined according to the amplitude variation value, and the automatic gain control is performed on the audio amplitude of the to-be-processed audio information based on the gain value of the audio amplitude to achieve the enhancement adjustment of the to-be-processed audio information.

In S2402, if the amplitude variation value is greater than the variation threshold, and the audio amplitude of the to-be-processed audio information is greater than a second audio threshold, the automatic gain control is performed on the audio amplitude of the to-be-processed audio information to achieve an attenuation adjustment of the to-be-processed audio information according to the amplitude variation value.

Here, the second audio threshold is greater than the first audio threshold. The second audio threshold may be set according to actual needs.

Specifically, if the amplitude variation value is less than the preset variation threshold, and the audio amplitude of the to-be-processed audio information is greater than the second audio threshold, the gain value of the audio amplitude when the automatic gain control is performed on the audio amplitude of the to-be-processed audio information is determined according to the amplitude variation value, and the automatic gain control is performed on the audio amplitude of the to-be-processed audio information based on the gain value of the audio amplitude to achieve the attenuation adjustment of the to-be-processed audio information.

In the above solutions, when the amplitude variation value of the to-be-processed audio information is relatively large, it is feasible to perform the automatic gain control on the to-be-processed audio information according to the amplitude variation value, and adjust the audio amplitude of the to-be-processed audio information to ensure the stability of the adjusted audio amplitude of the to-be-processed audio information.

In S250, a signal amplitude amplification process is performed on the adjusted to-be-processed audio information to determine amplified audio information according to the noise reduction degree of the VR device.

Here, the noise reduction degree of the VR device may be the noise reduction degree of the VR device itself or the noise reduction degree of the external earphones of the VR device. The noise reduction degree of the VR device itself or the noise reduction degree of the external earphones refers to the signal attenuation degree after active or passive noise reduction on the VR device or the external earphones.

Specifically, a signal amplitude amplification value of the to-be-processed audio information is determined according to the noise reduction degree of the VR device itself or the noise reduction degree of the external earphones of the VR device, and a signal amplitude amplification process is performed on the adjusted to-be-processed audio information according to the signal amplitude amplification value to determine the audio amplification information.

For example, for the external earphones of the VR device or the VR device having a noise reduction degree of 20 dB, it is feasible to determine the signal amplitude amplification value of the to-be-processed audio information is 20 dB, thereby ensuring the magnitude of the volume emitted by the speaker to be close to the magnitude of the real environmental sounds. In addition, the same VR device may be connected to earphones having different noise reduction degrees. Therefore, it is feasible to set a signal amplitude adjustment function to enable the user to adjust the signal amplitude of the to-be-processed audio information according to the user's needs.

In S260, an audio equalization process is performed on the amplified audio information to determine the target audio information according to the speaker frequency response characteristic of the VR device, and the target audio information is played by the speaker of the VR device.

Here, the audio equalization process, i.e., a paragraphic EQ adjustment, may be implemented by a parameter equalizer. The frequency response is generally associated with an electronic amplifier or speaker. The frequency response characteristic is the frequency response characteristic of the speaker. The frequency response refers to a phenomenon where when one audio signal output at a constant voltage is connected to the system, the sound pressure generated by the speaker increases or attenuates as the frequency changes, and the phase changes as the frequency changes.

For example, for a speaker with insufficient high frequency response, to ensure the pass-through loudness of the high-frequency environmental sound by the speaker, it is feasible to appropriately increase a high frequency gain in EQ parameters when the audio equalization process is performed on the amplified audio information. Since different speakers have different frequency response characteristics, to ensure the frequency characteristic of the target audio information sent out by the speaker to be stable, an EQ adjustment function may be set to enable the user adjust the EQ parameters of the to-be-processed audio information according to the user's needs.

In addition, the microphones of the VR device are generally far from the ears, and a frequency characteristic difference may exist between the acquired environmental audio information of the ambient environment and the environmental audio information at the position of the human ears. To achieve accurate pass-through of the environmental audio information, the frequency characteristic difference needs to be compensated when the audio equalization process is performed on the amplified audio information. For example, it is feasible to determine the difference curve of the frequency characteristic difference by an acoustic simulation or test, then, determine a set of filter parameters according to the difference curve, and compensate the frequency characteristic difference based on this set of filter parameters.

In the solutions of this embodiment, the environmental audio information of the ambient environment is acquired by the microphone on the VR device. The sound source position information of the environmental audio information is determined. The filtering process is performed on the environmental audio information to determine the filtered audio information. The directional pickup is performed on the filtered audio information to determine the to-be-processed audio information. The automatic gain control is performed on the to-be-processed audio information to adjust the audio amplitude of the to-be-processed audio information. The signal amplitude amplification process is performed on the adjusted to-be-processed audio information to determine amplified audio information according to the noise reduction degree of the VR device. The audio equalization process is performed on the amplified audio information to determine the target audio information according to the speaker frequency response characteristic of the VR device and the target audio information is played by the speaker of the VR device. The automatic gain control is performed on the to-be-processed audio information to ensure the target audio information not to be suddenly large or small to enable the volume of the target audio information to maintain within a relatively stable range. The signal amplitude amplification process is performed on the to-be-processed audio information to ensure the target audio information to be much closer to the real environmental sounds of the ambient environment. The audio equalization process is performed on the amplified audio information to ensure the target audio information to have a sound pass-through loudness that conforms to the frequency response characteristic of the speaker. In this manner, the use experience of the user with the VR device is improved.

Embodiment Three

Figure 3:
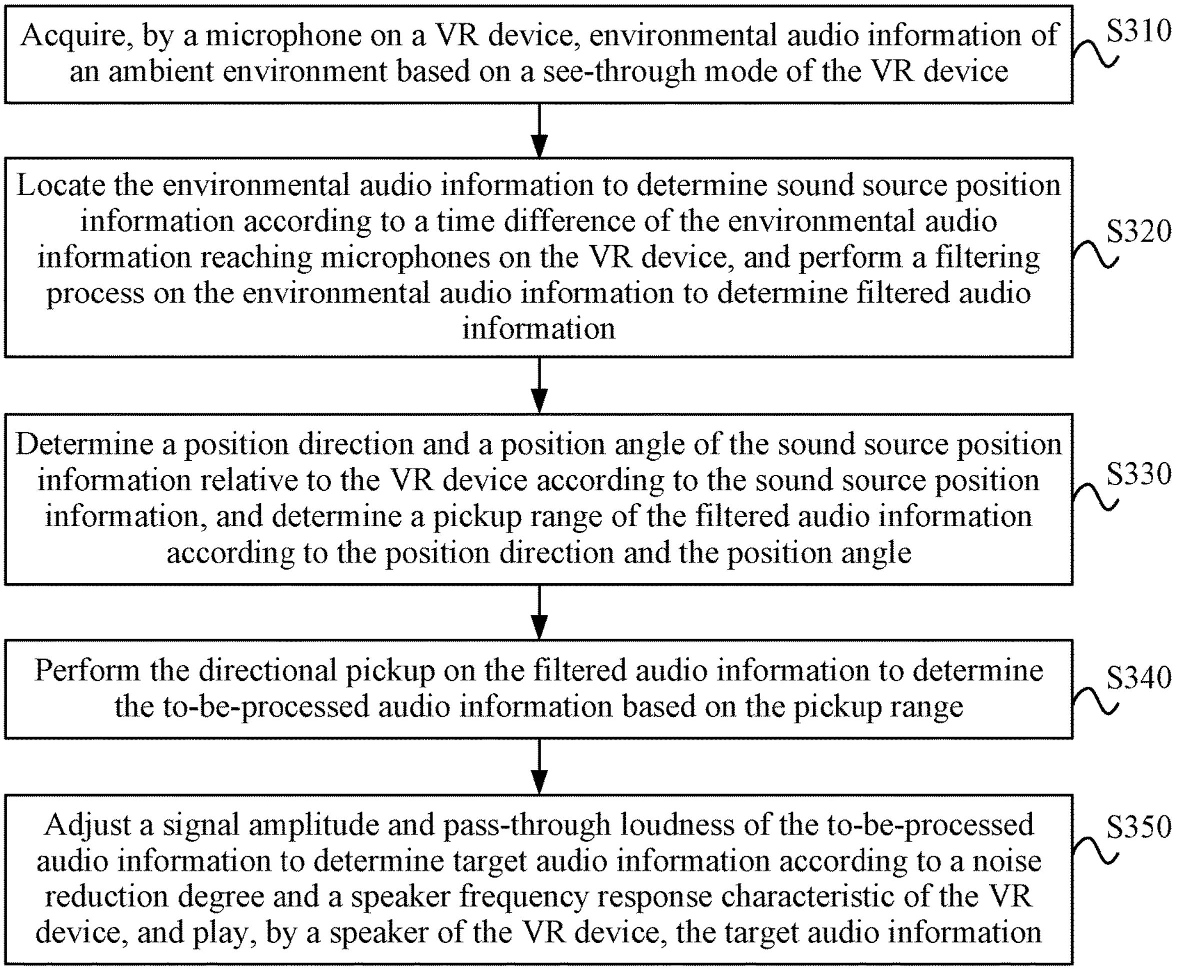
FIG. 3 is a flowchart of an environmental sound pass-through method applied to VR according to embodiment three of the present invention.

FIG. 3 is a flowchart of an environmental sound pass-through method applied to VR according to embodiment three of the present invention. This embodiment is optimized on the basis of the above embodiment to provide a preferred embodiment for performing the directional pickup on the filtered audio information to determine the to-be-processed audio information according to the sound source position information. Specifically, as shown in FIG. 3, the method includes the steps below.

In S310, environmental audio information of an ambient environment is acquired by a microphone on a VR device based on a see-through mode of the VR device.

In S320, the environmental audio information is located to determine sound source position information according to a time difference of the environmental audio information reaching microphones on the VR device, and a filtering process is performed on the environmental audio information to determine filtered audio information.

In S330, a position direction and a position angle of the sound source position information relative to the VR device are determined according to the sound source position information, and a pickup range of the filtered audio information is determined according to the position direction and the position angle.

Specifically, the position direction and the position angle of the sound source position information relative to the VR device are determined according to the sound source position information, and the pickup range where a sound beam of the filtered audio information is located is estimated according to the position direction and the position angle. For example, the position direction and the position angle of the sound source position information relative to the VR device may be 90° directly in front of the VR device. In this case, the pickup range of the filtered audio information may be estimated as 60° to 120° directly in front of the VR device.

In S340, the directional pickup is performed on the filtered audio information to determine the to-be-processed audio information based on the pickup range.

Specifically, after the pickup range of the filtered audio information is determined, the directional pickup is performed on the filtered audio information within the pickup range to determine the to-be-processed audio information.

In S350, a signal amplitude and pass-through loudness of the to-be-processed audio information are adjusted to determine target audio information according to a noise reduction degree and a speaker frequency response characteristic of the VR device, and the target audio information is played by a speaker of the VR device.

In the solutions of this embodiment, an optional embodiment for performing the directional pickup on the filtered audio information according to the sound source position information to determine the to-be-processed audio information is provided. In the above solutions, the environmental audio information of the ambient environment is acquired, and is located and filtered to obtain the sound source position information and the filtered audio information. Then, the pickup range of the filtered audio information is determined according to the sound source position information, and the directional pickup is performed on the filtered audio information based on the pickup range to determine the to-be-processed audio information. Then, the signal amplitude and the pass-through loudness of the to-be-processed audio information are adjusted to determine the target audio information, and the target audio information is played by the speaker of the VR device. In this manner, the accuracy and efficiency of the directional pickup can be improved when the directional pickup is performed on the filtered audio information.

Embodiment Four

Figure 4:
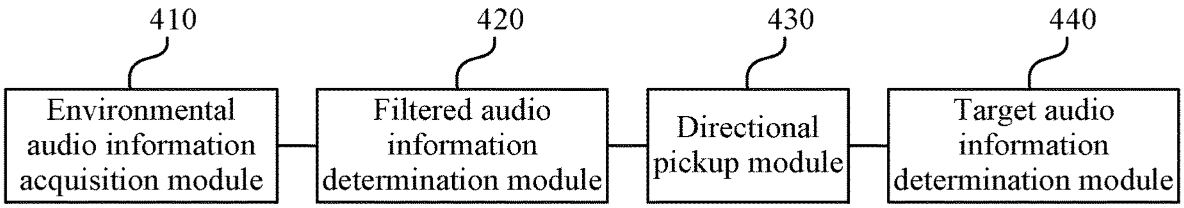
FIG. 4 is a structure diagram of an environmental sound pass-through device applied to VR according to embodiment fourth of the present invention.

FIG. 4 is a structure diagram of an environmental sound pass-through device applied to VR according to embodiment fourth of the present invention This embodiment is applicable to the case where a VR device achieves the environmental sound pass-through. As shown in FIG. 4, the environmental audio pass-through apparatus applied to VR includes: an environmental audio information acquisition module 410, a filtered audio information determination module 420, a directional pickup module 430, and a target audio information determination module 440.

The environmental audio information acquisition module 410 is configured to acquire environmental audio information of an ambient environment by a microphone on a VR device based on a see-through mode of the VR device.

The filtered audio information determination module 420 is configured to locate the environmental audio information to determine sound source position information according to a time difference of the environmental audio information reaching microphones on the VR device, and perform a filtering process on the environmental audio information to determine filtered audio information.

The directional pickup module 430 is configured to perform a directional pickup on the filtered audio information to determine to-be-processed audio information according to the sound source position information.

The target audio information determination module 440 is configured to adjust a signal amplitude and pass-through loudness of the to-be-processed audio information to determine target audio information according to a noise reduction degree and a speaker frequency response characteristic of the VR device, and play the target audio information by a speaker of the VR device.

In the solutions of the embodiments of the present invention, the environmental audio information of the ambient environment is acquired by the microphone on the VR device based on the see-through mode of the VR device. The environmental audio information is located to determine sound source position information according to the time difference of the environmental audio information reaching the microphones on the VR device, and the filtering process is performed on the environmental audio information to determine filtered audio information. The directional pickup is performed on the filtered audio information to determine the to-be-processed audio information according to the sound source position information. The signal amplitude and pass-through loudness of the to-be-processed audio information are adjusted to determine target audio information according to the noise reduction degree and the speaker frequency response characteristic of the VR device, and the target audio information is played by the speaker of the VR device. In this manner, the problem that the user of the VR product can only see the ambient environment images but cannot hear the ambient environment sounds after the VR product, during use, turns on the see-through mode is solved. In the above solutions, when the VR device is switched to the see-through mode, the environmental audio information is acquired by the microphone, the sound source position information of the environmental audio information is located, and the filtering process is performed on the environmental audio information, improving the clarity of the environmental audio information. The directional pickup is performed on the filtered audio information according to the sound source position information so that the extraction efficiency and accuracy of the to-be-processed audio information. According to the characteristics of the speaker of the VR device, the signal amplitude and pass-through loudness of the to-be-processed audio information are adjusted to ensure the target audio information played out by the speaker not to be suddenly large or small, improving the volume stability of the target audio information, meanwhile, enabling the adjusted target audio information to be much closer to the real environmental sounds, and improving the use experience of the user with the VR device.

For example, the target audio information determination module 440 includes: an audio amplitude determination unit, an amplified audio information determination unit and a target audio information determination unit.

The audio amplitude determination unit is configured to perform automatic gain control on the to-be-processed audio information to adjust an audio amplitude of the to-be-processed audio information.

The amplified audio information determination unit is configured to perform a signal amplitude amplification process on the adjusted to-be-processed audio information to determine amplified audio information according to the noise reduction degree of the VR device.

The target audio information determination unit is configured to perform an audio equalization process on the amplified audio information to determine the target audio information according to the speaker frequency response characteristic of the VR device.

For example, the audio amplitude determination unit is specifically configured to: if an amplitude variation value of the to-be-processed audio information is greater than a variation threshold, and the audio amplitude of the to-be-processed audio information is less than a first audio threshold, perform the automatic gain control on the audio amplitude of the to-be-processed audio information to achieve an enhancement adjustment of the to-be-processed audio information according to the amplitude variation value; and if the amplitude change value is greater than the change threshold, and the audio amplitude of the to-be-processed audio information is greater than a second audio threshold, perform the automatic gain control on the audio amplitude of the to-be-processed audio information to achieve an attenuation adjustment of the to-be-processed audio information according to the amplitude change value, where the second audio threshold is greater than the first audio threshold.

For example, the directional pickup module 430 is specifically configured to: determine a position direction and a position angle of the sound source position information relative to the VR device according to the sound source position information, and determine a pickup range of the filtered audio information according to the position direction and the position angle; and perform the directional pickup on the filtered audio information to determine the to-be-processed audio information based on the pickup range For example, the filtered audio information determination module 420 is specifically configured to: determine a sound band of the environmental audio information, determine an audio property of the environmental audio information according to the sound band, and determine a target passband according to the audio property and a correspondence between a candidate property and a filter passband; and perform the filtering process on the environmental audio information to determine the filtered audio information based on the target passband.

For example, the environmental audio information acquisition module 410 is specifically configured to: acquire, by the microphone on the VR device, mixing audio information; and perform an echo cancellation process on the mixing audio information to determine the environmental audio information of the ambient environment For example, the above environmental sound pass-through apparatus applied to VR also includes: an audio information shielding module, which is configured to control the speaker to shield other audio information other than the target audio information.

The environmental sound pass-through apparatus applied to VR provided by this embodiment is applicable to the environmental sound pass-through method applied to VR provided by any one of the above embodiments, and has corresponding functions and beneficial effects.

Embodiment Five

Figure 5:
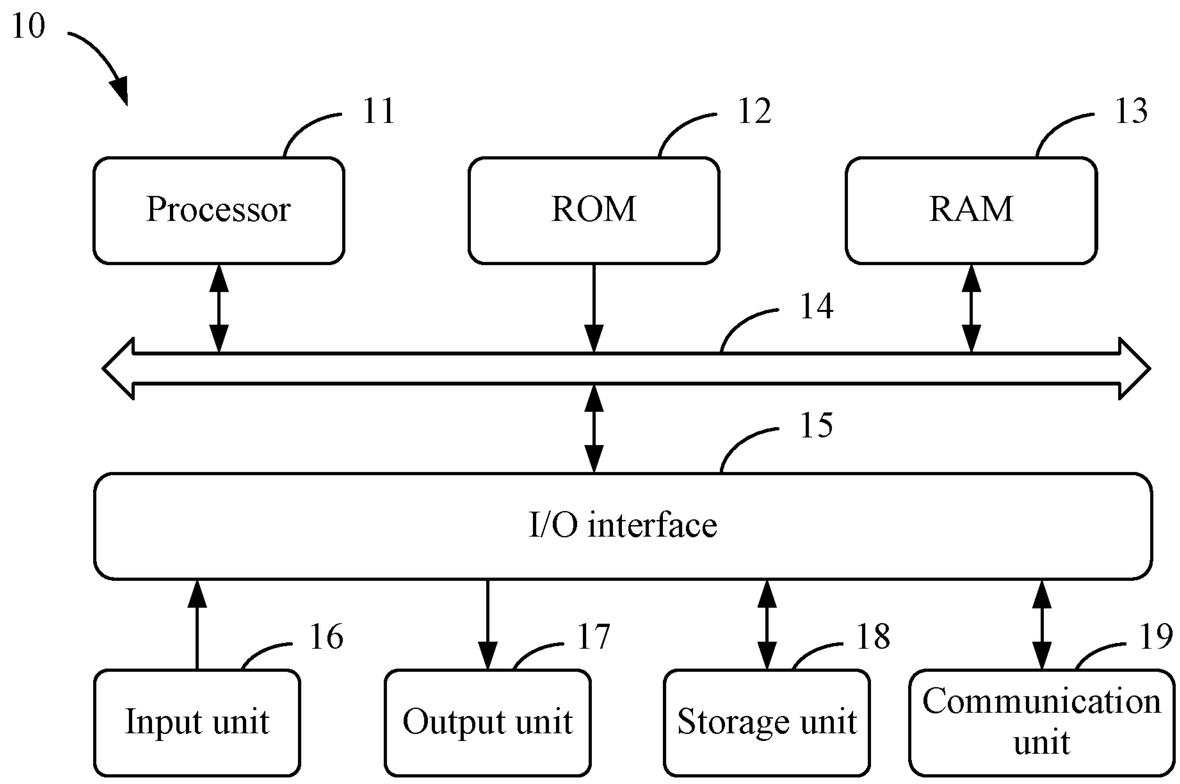
FIG. 5 is a structure diagram of an electronic device according to embodiment five of the present invention.

FIG. 5 is a structural diagram of an electronic device 10 for implementing the embodiments of the present invention. The electronic device is intended to represent various forms of digital computers, for example, a laptop computer, a desktop computer, a workbench, a personal digital assistant, a server, a blade server, a mainframe computer, or another applicable computer. The electronic device may also represent various forms of mobile apparatuses, for example, a personal digital assistant, a cellphone, a smartphone, a wearable device (such as a helmet, glasses, and a watch), or a similar computing apparatus. Herein the shown components, the connections and relationships between these components, and the functions of these components are illustrative only and are not intended to limit the implementation of the present invention as described and/or claimed herein.

As shown in FIG. 5, the electronic device 10 includes at least one processor 11 and a memory (such as a read-only memory (ROM) 12 and a random-access memory (RAM) 13) communicatively connected to the at least one processor 11. The memory stores a computer program executable by the at least one processor, and the processor 11 may perform various types of appropriate operations and processing according to a computer program stored in a ROM 12 or a computer program loaded from a storage unit 18 to a RAM 13. Various programs and data required for the operation of the electronic device 10 are also stored in the RAM 13. The processors 11, the ROM 12, and the RAM 13 are connected to each other through a bus 14. An input/output (I/O) interface 1505 is also connected to the bus 1504.

Multiple components in the electronic device 10 are connected to the I/O interface 15. The multiple components include an input unit 16 such as a keyboard or a mouse, an output unit 17 such as various types of displays or speakers, the storage unit 18 such as a magnetic disk or an optical disk, and a communication unit 19 such as a network card, a modem or a wireless communication transceiver. The communication unit 19 allows the electronic device 10 to exchange information/data with other devices over a computer network such as the Internet and/or various telecommunications networks.

The processor 11 may be various general-purpose and/or special-purpose processing components having processing and computing capabilities. Examples of the processor 11 include, but are not limited to, a central processing unit (CPU), a graphics processing unit (GPU), a special-purpose artificial intelligence (AI) computing chip, a processor executing machine learning models and algorithms, a digital signal processor (DSP), and any appropriate processor, controller and microcontroller. The processor 11 performs the various methods and processing described above, such as the environmental sound pass-through method applied to the VR.

In some embodiments, the environmental sound-pass-through method applied to the VR may be implemented as computer programs tangibly contained in a non-transitory computer-readable storage medium such as the storage unit 18. In some embodiments, part or all of computer programs may be loaded and/or installed onto the electronic device 10 via the ROM 12 and/or the communication unit 19. When the computer programs are loaded to the RAM 13 and executed by the processor 11, one or more steps of the above environmental sound-pass-through method applied to the VR may be performed. Alternatively, in other embodiments, the processor 11 may be configured, in any other suitable manner (for example, by use of firmware), to perform the environmental sound-pass-through method applied to the VR.

Herein various embodiments of the systems and techniques described above may be implemented in digital electronic circuitry, integrated circuitry, field-programmable gate arrays (FPGAs), application-specific integrated circuits (ASICs), application-specific standard products (ASSPs), systems on chips (SoCs), complex programmable logic devices (CPLDs), computer hardware, firmware, software and/or combinations thereof. The various embodiments may include implementations in one or more computer programs. The one or more computer programs are executable and/or interpretable on a programmable system including at least one programmable processor. The programmable processor may be a dedicated or general-purpose programmable processor for receiving data and instructions from a memory system, at least one input device and at least one output device and transmitting the data and instructions to the memory system, the at least one input device and the at least one output device.

Computer programs for implementation of the methods of the present invention may be written in one programming language or any combination of multiple programming languages. These computer programs may be provided for a processor of a general-purpose computer, a special-purpose computer or another programmable data processing apparatus such that the computer programs, when executed by the processor, cause functions/operations specified in the flowcharts and/or block diagrams to be implemented. The computer programs may be executed entirely on a machine, partly on a machine, as a stand-alone software package, partly on a machine and partly on a remote machine, or entirely on a remote machine or a server.

In the context of the present invention, the computer-readable storage medium may be a tangible medium including or storing a computer program that is used by or used in conjunction with an instruction execution system, apparatus or device. The computer-readable storage medium may include, but is not limited to, an electronic, magnetic, optical, electromagnetic, infrared or semiconductor system, apparatus or device, or any suitable combination thereof. Alternatively, the computer-readable storage medium may be a machine-readable signal medium. Concrete examples of the machine-readable storage medium may include an electrical connection based on one or more wires, a portable computer disk, a hard disk, a random-access memory (RAM), a read-only memory (ROM), an erasable programmable read-only memory (EPROM) or a flash memory, an optical fiber, a portable compact disc read-only memory (CD-ROM), an optical storage device, a magnetic storage device, or any appropriate combination thereof.

In order that interaction with a user is provided, the systems and techniques described herein may be implemented on the electronic device. The electronic device has a display device (for example, a cathode-ray tube (CRT) or a liquid-crystal display (LCD) monitor) for displaying information to the user; and a keyboard and a pointing device (for example, a mouse or a trackball) through which the user can provide input for the electronic device. Other types of apparatuses may also be used for providing interaction with a user. For example, feedback provided for the user may be sensory feedback in any form (for example, visual feedback, auditory feedback, or haptic feedback). Moreover, input from the user may be received in any form (including acoustic input, voice input, or haptic input).

The systems and techniques described herein may be implemented in a computing system including a back-end component (for example, a data server), a computing system including a middleware component (for example, an application server), a computing system including a front-end component (for example, a client computer having a graphical user interface or a web browser through which a user can interact with implementations of the systems and techniques described herein), or a computing system including any combination of such back-end, middleware or front-end components. Components of a system may be interconnected by any form or medium of digital data communication (for example, a communication network). Examples of the communication network include a local area network (LAN), a wide area network (WAN), a block-chain network and the Internet.

The computing system may include a client and a server. The client and the server are usually far away from each other and generally interact through the communication network. The relationship between the client and the server arises by virtue of computer programs running on respective computers and having a client-server relationship to each other. The server may be a cloud server, also referred to as a cloud computing server or a cloud host. As a host product in a cloud computing service system, the server solves the defects of difficult management and weak service scalability in a related physical host and a related virtual private server (VPS).

It is to be understood that various forms of the preceding flows may be used with steps reordered, added, or removed. For example, the steps described in the present invention may be performed in parallel, in sequence, or in a different order as long as the desired result of the solutions provided in the present invention can be achieved. The execution sequence of these steps is not limited herein.

The scope of the present invention is not limited to the preceding embodiments. It is to be understood by those skilled in the art that various modifications, combinations, sub-combinations, and substitutions may be made according to design requirements and other factors. Any modification, equivalent substitution, improvement and the like made within the spirit and principle of the present invention fall within the scope of the present invention.

What is claimed is:

1. An environmental sound pass-through method applied to virtual reality (VR), comprising:
acquiring environmental audio information of an ambient environment by a microphone on a VR device based on a see-through mode of the VR device;
locating the environmental audio information to determine sound source position information according to a time difference of the environmental audio information reaching microphones on the VR device, and performing a filtering process on the environmental audio information to determine filtered audio information;
performing directional pickup on the filtered audio information to determine to-be-processed audio information according to the sound source position information; and
adjusting a signal amplitude and pass-through loudness of the to-be-processed audio information to determine target audio information according to a noise reduction degree and a speaker frequency response characteristic of the VR device, and playing the target audio information by a speaker of the VR device,
wherein adjusting the signal amplitude and the pass-through loudness of the to-be-processed audio information to determine the target audio information comprises:
performing automatic gain control on the to-be-processed audio information to adjust an audio amplitude of the to-be-processed audio information;
performing a signal amplitude amplification process on the adjusted to-be-processed audio information to determine amplified audio information according to the noise reduction degree of the VR device; and
performing an audio equalization process on the amplified audio information to determine the target audio information according to the speaker frequency response characteristic of the VR device.

2. The method of claim 1, wherein performing the automatic gain control on the to-be-processed audio information to adjust the audio amplitude of the to-be-processed audio information comprises:
in response to an amplitude variation value of the to-be-processed audio information being greater than a variation threshold, and the audio amplitude of the to-be-processed audio information being less than a first audio threshold, performing the automatic gain control on the audio amplitude of the to-be-processed audio information to achieve an enhancement adjustment of the to-be-processed audio information according to the amplitude variation value; and
in response to the amplitude variation value being greater than the variation threshold, and the audio amplitude of the to-be-processed audio information being greater than a second audio threshold, performing the automatic gain control on the audio amplitude of the to-be-processed audio information to achieve an attenuation adjustment of the to-be-processed audio information according to the amplitude variation value, wherein the second audio threshold is greater than the first audio threshold.

3. The method of claim 1, wherein performing the directional pickup on the filtered audio information to determine the to-be-processed audio information according to the sound source position information comprises:
determining a position direction and a position angle of a sound source position relative to the VR device according to the sound source position information, and determining a pickup range of the filtered audio information according to the position direction and the position angle; and
performing the directional pickup on the filtered audio information to determine the to-be-processed audio information based on the pickup range.

4. The method of claim 1, wherein performing the filtering process on the environmental audio information to determine the filtered audio information comprises:
determining a sound band of the environmental audio information, determining an audio property of the environmental audio information according to the sound band, and determining a target passband according to the audio property and a correspondence between a candidate property and a filter passband; and
performing the filtering process on the environmental audio information to determine the filtered audio information based on the target passband.

5. The method of claim 1, wherein acquiring the environmental audio information of the ambient environment by the microphone on the VR device comprises:
acquiring mixing audio information by the microphone on the VR device; and
performing an echo cancellation process on the mixing audio information to determine the environmental audio information of the ambient environment.

6. The method of claim 1, further comprising:
controlling the speaker to shield other audio information other than the target audio information.

7. An electronic device, comprising:
at least one processor and
a memory communicatively connected to the at least one processor,
wherein the memory stores a computer program executable by the at least one processor to enable the at least one processor to perform:
acquiring environmental audio information of an ambient environment by a microphone on a VR device based on a see-through mode of the VR device;
locating the environmental audio information to determine sound source position information according to a time difference of the environmental audio information reaching microphones on the VR device, and performing a filtering process on the environmental audio information to determine filtered audio information;
performing directional pickup on the filtered audio information to determine to-be-processed audio information according to the sound source position information; and
adjusting a signal amplitude and pass-through loudness of the to-be-processed audio information to determine target audio information according to a noise reduction degree and a speaker frequency response characteristic of the VR device, and playing the target audio information by a speaker of the VR device,
wherein adjusting the signal amplitude and the pass-through loudness of the to-be-processed audio information to determine the target audio information comprises:
performing automatic gain control on the to-be-processed audio information to adjust an audio amplitude of the to-be-processed audio information;
performing a signal amplitude amplification process on the adjusted to-be-processed audio information to determine amplified audio information according to the noise reduction degree of the VR device; and performing an audio equalization process on the amplified audio information to determine the target audio information according to the speaker frequency response characteristic of the VR device.

8. The electronic device of claim 7, wherein performing the automatic gain control on the to-be-processed audio information to adjust the audio amplitude of the to-be-processed audio information comprises:

in response to an amplitude variation value of the to-be-processed audio information being greater than a variation threshold, and the audio amplitude of the to-be-processed audio information being less than a first audio threshold, performing the automatic gain control on the audio amplitude of the to-be-processed audio information to achieve an enhancement adjustment of the to-be-processed audio information according to the amplitude variation value; and in response to the amplitude variation value being greater than the variation threshold, and the audio amplitude of the to-be-processed audio information being greater than a second audio threshold, performing the automatic gain control on the audio amplitude of the to-be-processed audio information to achieve an attenuation adjustment of the to-be-processed audio information according to the amplitude variation value, wherein the second audio threshold is greater than the first audio threshold.

9. The electronic device of claim 7, wherein performing the directional pickup on the filtered audio information to determine the to-be-processed audio information according to the sound source position information comprises:

determining a position direction and a position angle of a sound source position relative to the VR device according to the sound source position information, and determining a pickup range of the filtered audio information according to the position direction and the position angle; and performing the directional pickup on the filtered audio information to determine the to-be-processed audio information based on the pickup range.

10. The electronic device of claim 7, wherein performing the filtering process on the environmental audio information to determine the filtered audio information comprises:

determining a sound band of the environmental audio information, determining an audio property of the environmental audio information according to the sound band, and determining a target passband according to the audio property and a correspondence between a candidate property and a filter passband; and performing the filtering process on the environmental audio information to determine the filtered audio information based on the target passband.

11. The electronic device of claim 7, wherein acquiring the environmental audio information of the ambient environment by the microphone on the VR device comprises:

acquiring mixing audio information by the microphone on the VR device; and performing an echo cancellation process on the mixing audio information to determine the environmental audio information of the ambient environment.

12. The electronic device of claim 7, wherein the computer program executable by the at least one processor to enable the at least one processor to further perform:

controlling the speaker to shield other audio information other than the target audio information.

13. A non-transitory computer-readable storage medium, which is configured to store a computer instruction which, when executed by a processor, causes the processor to perform the environmental sound pass-through method of claim 1.

* * * * *